United States Patent [19]

Miller

[11] 4,128,901
[45] Dec. 5, 1978

[54] GROUND-REFERENCE POWER SUPPLY FOR GAS DISCHARGE DISPLAY/MEMORY PANEL DRIVING AND ADDRESSING CIRCUITRY

[75] Inventor: John W. V. Miller, Toledo, Ohio

[73] Assignee: Owens-Illinois, Inc., Toledo, Ohio

[21] Appl. No.: 825,291

[22] Filed: Aug. 17, 1977

[51] Int. Cl.² .................. G11C 7/00; G11C 11/28
[52] U.S. Cl. .................. 365/116; 315/169 TV; 340/324 M; 365/199
[58] Field of Search .................. 340/324 M; 365/116, 365/199; 315/169 TV

[56] References Cited

U.S. PATENT DOCUMENTS

| | | | |
|---|---|---|---|
| 3,689,912 | 9/1972 | Dick | 365/116 |
| 3,811,124 | 5/1974 | Kleen et al. | 365/116 |
| 3,909,804 | 9/1975 | Kaji et al. | 365/116 |

*Primary Examiner*—Stuart N. Hecker
*Attorney, Agent, or Firm*—Donald K. Wedding; Myron E. Click; David H. Wilson

[57] ABSTRACT

A ground-reference addressing power supply is connected to the driving and addressing circuitry of a gas discharge display/memory panel for generating write and erase pulse voltages. The addressing power supply is referenced to the same ground potential as the sustainer power supply and is switched on at the desired points in the sustainer wave form for the selective addressing of the panel cells. The addressing power supply can generate different potentials for the write and erase pulse voltages so that each potential level can be set independently of the other to maximize the size of the addressing window.

8 Claims, 4 Drawing Figures

GROUND-REFERENCE POWER SUPPLY FOR GAS DISCHARGE DISPLAY/MEMORY PANEL DRIVING AND ADDRESSING CIRCUITRY

BACKGROUND OF THE INVENTION

1. Field of the Invention

This invention relates to circuits for controlling gas discharge devices, especially multiple gas discharge display/memory devices which have an electrical memory and which are capable of producing a visual display or representation of data.

2. Description of the Prior Art

Heretofore, multiple gas discharge display and/or memory panels have been proposed in the form of a pair of dielectric charge storage members which are backed by electrodes, the electrodes being so formed and oriented with respect to an ionizable gaseous medium as to define a plurality of discrete gas discharge units or cells. The cells have been defined by a surrounding or confining physical structure such as the walls of apertures in a perforated glass plate sandwiched between glass surfaces and they have been defined in an open space between glass or other dielectric backed with conductive electrode surfaces by appropriate choices of the gaseous medium, its pressure and the electrode geometry. In either structure, charges (electrons and ions) produced upon ionization of the gas volume of a selected discharge cell, when proper alternating operating voltages are applied between the opposed electrodes, are collected upon the surface of the dielectric at specifically defined locations. These charges constitute an electrical field opposing the electrical field which created them so as to reduce the voltage and terminate the discharge for the remainder of the cycle portion during which the discharge producing polarity remains applied. These collected charges aid an applied voltage of the polarity opposite that which created them in the initiation of a discharge by imposing a total voltage across the gas sufficient to again initiate a discharge and a collection of charges. This repetitive and alternating charge collection and ionization discharge constitutes an electrical memory.

An example of a panel structure containing non-physically isolated or open discharge cells is disclosed in U.S. Pat. No. 3,499,167 issued to Theodore C. Baker, et al. Physically isolated cells have been disclosed in the article by D. L. Bitzer and H. G. Slottow entitled "The Plasma Display Panel — A Digitally Addressable Display With Inherent Memory" Proceeding of the Fall Joint Computer Conference, I E E E, San Francisco, Cal., November 1966, pp 541 – 547 and in U.S. Pat. No. 3,559,190.

One construction of a memory/display panel includes a continuous volume of ionizable gas confined between a pair of dielectric surfaces backed by conductor arrays, typically in parallel lines with the arrays of lines orthogonally related, to define in the region of the projected intersections as viewed along the common perpendicular to each array, a plurality of opposed pairs of charge storage areas on the surfaces of the dielectric bounding or confining the gas. Many variations of the individual conductor form, the array form, their relationship to each other and to the dielectric and gas are available, hence the orthogonally related, parallel line arrays which are discussed herein are merely illustrative.

In prior art, a wide variety of gases and gas mixtures have been utilized as the ionizable gaseous medium, it being desirable that the gas provide a copious supply of charges during discharge, be inert to the materials with which it came in contact and, where a visual display is desired, be one which produces a visible light or radiation which stimulates a phosphor. Preferred embodiments of the display panel have utilized at least one rare gas, more preferably at least two, selected from helium, neon, argon, krypton or xenon.

In the operation of the display/memory device an alternating voltage is applied, typically, by applying a first periodic voltage wave form to one array and applying a cooperating second wave form, frequently identical to and shifted on the time axis with respect to the first wave form, to the opposed array to impose a voltage across the cells formed by the opposed arrays of electrodes which is the algebraic sum of the first and second wave forms. The cells have a voltage at which a discharge is initiated. That voltage can be derived from an externally applied voltage or a combination of wall charge potential and an externally applied voltage. Ordinarily, the entire cell array is excited by an alternating voltage which, by itself, is of insufficient magnitude to ignite gas discharges in any of the elements. When the walls are appropriately charged, as by means of a previous discharge, the voltage applied across the element will be augmented, and a new discharge will be ignited. Electrons and ions again flow to the dielectric walls extinguishing the discharge. However, on the following half cycle, their resultant wall charges again augment the applied external voltage and cause a discharge in the opposite direction. The sequence of electrical discharges is sustained by an alternating voltage signal that, by itself, could not initiate that sequence.

In addition to the sustaining voltage, there are manipulating voltages or addressing voltages imposed on the opposed electrodes of a selected cell or cells to alter the state of those cells selectively. One such voltage, termed a "writing voltage," transfers a cell or discharge site from the quiescent to the discharging state by virtue of a total applied voltage across the cell sufficient to make it probable that on subsequent sustaining voltage half cycles the cell will be in the "on state." A cell in the "on state" can be manipulated by an addressing voltage, termed an "erase voltage," which transfers it to the "off state" by imposing sufficient voltage to draw off the surface or wall charges on the cell walls and cause them to discharge without being collected on the opposite cell walls in an amount such that succeeding sustainer voltage transitions are not augmented sufficiently by wall charges to ignite discharges.

A common method of producing writing voltages is to superimpose voltage pulses on a sustainer wave form in an aiding direction and cumulatively with the sustainer voltage, the combination having a potential of enough magnitude to fire an "off state" cell into the "on state." Erase voltages are produced by superimposing voltage pulses on a sustainer wave form in opposition to the sustainer voltage to develop a potential sufficient to cause a discharge in an "on state" cell and draw the charges from the dielectric surfaces such that the cell will be in the "off state." The wall voltage of a discharged cell is termed an "off state wall voltage" and frequently is midway between the extreme magnitude limits of the sustainer voltage.

The stability characteristics and non-linear switching properties of these bistable cells are such that, in the case of a cell which has not fired in the preceding half cycle of sustaining voltage, the state of such cell in the cell array can be changed by selective application of an external voltage which exceeds the firing or discharge igniting potential. In the case of a cell which has been fired in the preceding half cycle and has accumulated charges which can aid the sustaining voltage, the cell can be turned off by applying a voltage which discharges the cell. These manipulating signals are applied in a timed relationship with the alternating sustaining voltage and, through control of discharge intensity, accomplish selective state transitions by changing the wall voltage of only the cell being addressed.

Cells are transferred to the "on state" by applying a portion of the manipulating signal superimposed on the sustaining voltage, termed a "select signal," on each of two opposed electrode portions which are proximate the cell. Conventionally, like sustaining signals are imposed on each electrode array so that half the sustaining voltage is imposed on each array and half the select signal is imposed on the addressed cell electrode in each electrode array at a time when the sum of the applied voltages is sufficient to ignite a discharge. Further, the partial select signals on each electrode are limited to a value which will not impose a firing potential across other cells defined by that electrode and not selected. A typical write signal for a cell is developed by applying half select voltages to the addressed electrodes of the cell to be placed in the "on state" at a time the sustaining voltages are developing a pedestal potential somewhat below the maximum sustaining voltage. Typically, a write signal is imposed on each opposed electrode portion of the cell during the terminal portion of a sustain voltage half cycle when any wall charging which may result from the prior sustainer transient is substantially completed. The manipulating signal thus ignites a single, and unique, cell at the intersection of the selected two opposed electrodes. This ignited discharge thus establishes the cell in the "on state" since a quantity of charge is stored in the cell such that, on each succeeding half cycle of the sustaining voltage, a gaseous discharge will be produced.

In order to erase a cell or transfer it from the "on state" to the "off state," the erase signal is imposed as a firing voltage which extends from the sustainer voltage toward and through the neutral wall charge voltage level. As for writing, the erase manipulation is facilitated if the sustaining voltage is at a pedestal level below the level providing the maximum applied voltage so that the erase partial select voltages are at a convenient level. Typically, an erase signal is imposed on each opposed electrode portion of the cell during the terminal portion of a sustain voltage half cycle, when the wall charging from the prior sustainer discharge is substantially completed, but preceding the next half cycle alternation by enough time so that the wall discharge of the selected cell is substantially stabilized.

Circuitry for sustaining voltages, and where employed, their pedestal, and for the manipulating voltages for writing and erasing individual cells can be quite extensive. Transformer coupling of manipulating signals to the electrodes of multiple gas discharge display/-memory devices has been disclosed in William E. Johnson et al. U.S. Pat. No. 3,618,071 for "Interfacing Circuitry and Method For Multiple-Discharge Gaseous Display and/or Memory Panels" which issued Nov. 2, 1971. The coupling of individual electrodes in large arrays involving substantial numbers of electrodes is cumbersome and expensive. Accordingly, solid-state pulser circuits capable of feeding through the sustaining voltage were proposed as exemplified in William E. Johnson U.S. Pat. No. 3,611,296 of Oct. 5, 1971 for "Driving Circuitry For Gas Discharge Panel." Multiplexing of the signals to the electrodes in an array has been utilized employing combinations of diode and resistor pulsers to manipulate cell potentials as shown in U.S. Pat. No. 3,684,918 issued Aug. 15, 1972 to Larry J. Schmersal for "Gas Discharge Display/Memory Panels and Selection and Addressing Circuits Therefor."

SUMMARY OF THE INVENTION

The present invention concerns an operating system for a multicelled gas discharge display/memory device wherein a pair of opposed electrode arrays with proximate portions of at least one electrode in each array defining the cells. A sustainer voltage source cyclically imposes a pulsating voltage having a period and a maximum potential across each of the cells. A switching means is provided to select a pair of opposed electrodes corresponding to a selected cell. An addressing means generates address voltage pulses to manipulate the discharge state of individual cells between an "on state" and an "off state." In accordance with the present invention, the address pulses are generated by a pulser means and a ground-referenced voltage supply. The utilization of ground-referenced voltage supplies eliminates the need for floating power supplies in the addressing circuit.

The alternating sustainer voltage source includes a pair of pull-up circuits each one of which is connected between a maximum potential source and a respective electrode array and a pair of pull-down circuits each one of which is connected between a source of ground reference voltage and a respective electrode array. The magnitude of the alternating sustainer wave form which appears across the cells is sufficient to maintain a cell in either an "off state" or an "on state."

The switching means comprises a plurality of normally open switches, each one of which is connected between said addressing means and each electrode of the pair of opposed spaced electrode arrays. When addressing a cell, the switches which are connected to the pair of opposed electrodes which define a selected cell are closed during the generation of an address pulse.

The addressing means includes a first pulser means connected to one electrode array for generating a first partial select voltage pulse and second pulser means connected to the other electrode array for generating a second partial select voltage pulse. Both pulser means utilize ground-referenced power supplies and the magnitude of the resultant address voltage pulse across a selected cell is independent of the magnitude of the sustainer wave form.

It is an object of the present invention to simplify the power supplies required for the driving and addressing circuits of a gas discharge display/memory panel by eliminating the floating power supplies and reducing the number of raw power supplies required.

It is another object of the present invention to maximize the size of the write-erase window for a gas discharge display/memory panel.

DESCRIPTION OF THE PREFERRED EMBODIMENT

Figure 1:
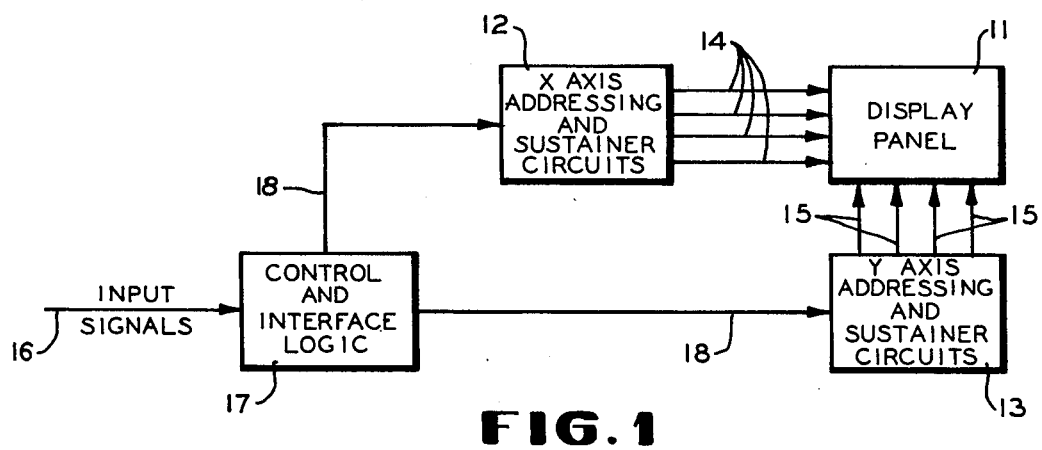
FIG. 1 is a block diagram of a multicelled gas discharge display/memory device and operating system therefor.

There is shown in FIG. 1 a block diagram of a multicelled gas discharge display/memory device and operating system therefor to which the present invention is applicable. The device is represented as a display panel 11 which can be of the type disclosed in U.S. Pat. No. 3,499,167 issued to Theodore C. Baker et al. The panel 11 includes a pair of opposed electrode arrays (not shown) with proximate electrode portions of at least one electrode in each array defining the cells. The addressing and sustainer wave forms are generated by a pair of addressing and sustainer circuits, an X axis circuit 12 and a Y axis circuit 13, which are connected to the X axis and Y axis electrode arrays respectively. A plurality of leads 14 are representative of the interconnections between the X axis circuit 12 and the X axis electrodes (not shown) of the panel 11 and a plurality of leads 15 are representative of similar interconnections on the Y axis. The information to be displayed by the panel 11 is externally generated and applied as input signals on one or more input lines 16 to a control and interface logic circuit 17. The circuit 17 buffers and decodes the input signals to generate control signals on lines 18 to the circuits 12 and 13.

Figure 2:
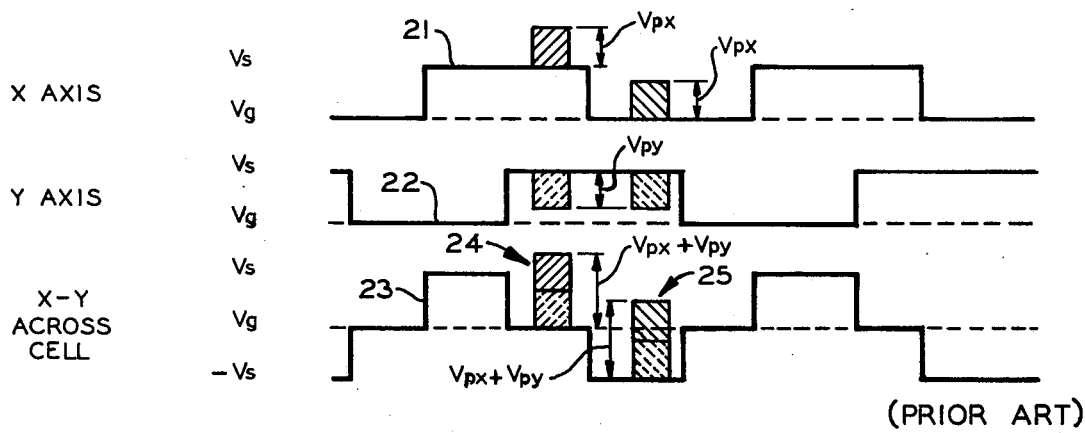
FIG. 2 is a wave form diagram of the prior art sustainer wave form with "write" and "erase" pulses referenced from the sustainer wave form.

There is shown in FIG. 2 the prior art addressing and sustainer wave forms which are generated by the circuits 12 and 13 of FIG. 1. During the operation of the panel 11, the X and Y sustainer circuits impress the sustainer voltages on the X and Y electrode arrays respectively. As shown in FIG. 2, an X axis sustainer wave form 21 is generated with a magnitude which alternates between a maximum sustainer potential Vs and a minimum potential Vg which can be ground potential. A Y axis wave form 22 is generated in a similar manner and the wave forms are combined across the panel cells to generate a composite sustainer wave form 23 having a magnitude equal to the sum of the magnitudes of the wave forms 21 and 22.

Prior art addressing systems having utilized floating power supplies to generate the addressing voltage pulses for turning on and off the panel cells. Thus, on the X axis, a floating power supply (not shown) generates an addressing pulse Vpx which is referenced from the sustainer wave form 21 and is added thereto. On the Y axis, a floating power supply (not shown) generates an addressing pulse Vpy which is referenced from the sustainer wave form 22 and is subtracted therefrom. The Vpx and Vpy addressing pulses add together, as shown in the composite wave form, to generate a write pulse 24 and an erase pulse 25 referenced from the composite sustainer wave form 23.

Figure 3:
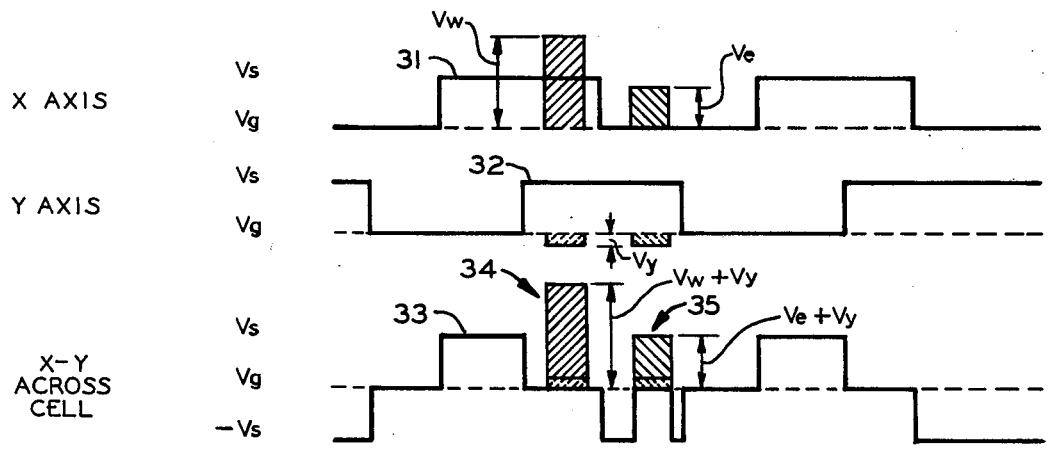
FIG. 3 is a wave form diagram of the sustainer wave form with ground referenced "write" and "erase" pulses according to the present invention.

There is shown in FIG. 3 the addressing and sustainer wave forms which are generated by addressing and sustainer circuits according to the present invention. The sustainer wave form is similar to that shown in the prior art wave form of FIG. 2. An X axis sustainer wave form 31 and a Y axis sustainer wave form 32 are combined to generate a composite sustainer wave form 33 which is applied to all cells in the display panel. However, the floating power supplies used to apply the address pulses of FIG. 2 have been replaced with one or more ground-referenced supplies. Hence, the addressing voltage pulses of FIG. 3 are referenced from the ground potential Vg.

On the X axis, a pair of ground-reference power supplies generate a write address pulse Vw and an erase address pulse Ve. On the Y axis, a ground-reference power supply generates an address pulse Vy. The Vw and Vy wave forms add together, as shown with the composite wave form 33, to generate a write pulse 34 and the Ve and Vy wave forms add together to generate an erase pulse 35. As shown, the write and erase pulses are referenced from the Vg potential level of the composite sustainer wave form 33.

Figure 4:
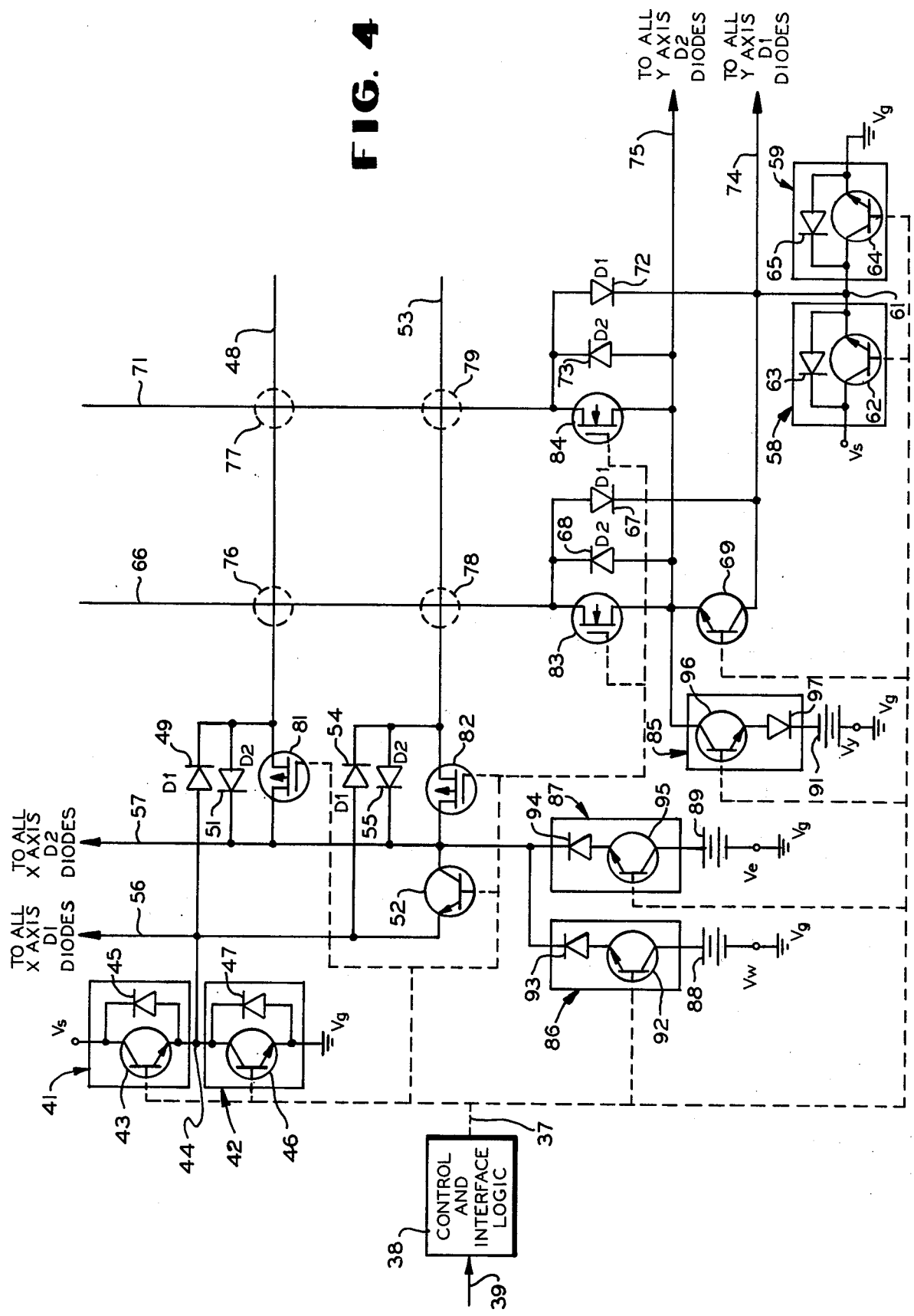
FIG. 4 is a partial schematic, partial block diagram of a portion of the addressing and sustainer circuits according to the present invention.

FIG. 4 is a partial schematic, partial block diagram of a portion of the addressing and sustainer circuits according to the present invention which utilize ground-referenced addressing power supplies. A plurality of dashed lines 37 represent the control lines which are utilized to transmit control signals from a control and interface logic circuit 38 to the various circuit switching devices. The circuit 38 generates the control signals necessary to generate the sustainer wave forms and address pulses of FIG. 3. The information to be displayed is externally generated and applied to the circuit 38 on an input line 39.

The X axis sustainer circuit includes two switching circuits, an X pull-up circuits 41 and an X pull-down circuit 42. The X pull-up circuit 41 is connected to a sustainer voltage power supply (not shown) to receive a sustainer voltage Vs. The circuit 41 is represented as an NPN transistor 43 having a collector connected to the Vs power supply, a base connected to the line 37 to receive control signals from the circuit 38 and an emitter connected to a common junction 44 for the circuits 41 and 42. A diode 45 has a cathode connected to the collector and an anode connected to the emitter of the transistor 43 to function as a diode clamp. The X pull-down circuit 42 is connected to a sustainer power supply (not shown) to receive a ground voltage Vg which is the neutral or reference potential for the sustainer wave form. The circuit 42 is represented by an NPN transistor 46 having a collector connected to the common junction 44, a base connected to the line 37 to receive control signals from the circuit 38, and an emitter connected to the sustainer voltage power supply voltage Vg. A diode 47 has a cathode connected to the collector of transistor 46 and an anode connected to the emitter to function as a diode clamp.

In FIG. 4 there is shown a pair of X axis and a pair of Y axis electrodes defining at their crosspoints gas discharge cells. Each electrode is connected to its own pair of isolation diodes designated D1 and D2. These diodes are oppositely poled to provide low impedance paths for the sustainer current flow and to isolate each electrode from all the other electrodes in the panel during addressing.

The circuits 41 and 42 are connected to an X axis electrode 48 through a D1 diode 49, a D2 diode 51 and a diode switch 52. The D1 diode 49 has an anode connected to the common junction 44 and a cathode connected to the electrode 48. The D2 diode 51 has a cathode connected to the diode switch 52 and an anode connected to the electrode 48. The diode switch 52 is represented as an NPN transistor having a collector connected to the D2 diodes, a base connected to receive control signals from the circuit 38 and an emitter connected to the common junction 44. The circuits 41 and 42 are also connected to an X axis electrode 53 through a D1 diode 54, a D2 diode 55 and the diode switch 52. The X axis sustainer circuits are also connected to all other X axis electrodes through a plurality of D1 diodes and D2 diodes. The circuits 41 and 42 are connected to all of the X axis D1 diodes by a line 56 and to all the X axis D2 diodes through the diode switch 52 and a line 57.

During normal operation, the X axis sustainer circuits are individually enabled to generate the X axis sustainer wave form 31 of FIG. 3 which is applied to all X axis electrodes. When the circuit 41 is enabled and the circuit 42 is disabled, the Vs potential of the wave form is such that the sustainer current flows through the D1 diodes and the Vs potential appears at all X axis electrodes. When the circuit 42 is enabled, the circuit 41 is disabled and the diode switch 52 is turned on, the ground potential Vg is applied to all X axis electrodes through the D2 diodes and the turned on diode switch.

The Y axis also has sustainer circuits similar to the X axis circuits 41 and 42, such as a Y pull-up circuit 58 connected between the Vs power supply (not shown) and a common junction 61 and a Y pull-down circuit 59 connected between the Vg power supply (not shown) and the common junction 61. The Y pull-up circuit 58 is comprised of an NPN transistor 62 and a clamping diode 63 connected in a manner similar to the elements of the circuit 41. The Y pull-down circuit 59 is also comprised of an NPN transistor 64 and a clamping diode 65 connected in a manner similar to the elements of the circuit 42.

The circuits 58 and 59 are connected to a Y axis electrode 66 through a D1 diode 68, a D2 diode 67, and a diode switch 69. The D1 diode 68 has a cathode connected to the common junction 61 and an anode connected to the electrode 66. The D2 diode 67 has an anode connected to the diode switch 69 and a cathode connected to the electrode 66. The diode switch 69 is represented as an NPN transistor having an emitter connected to the anodes of the D2 diodes, a base connected to receive control signals from the circuit 38, and a collector connected to the common junction 61.

The circuits 58 and 59 are connected in a similar manner to a Y axis electrode 71 through a D1 diode 72, a D2 diode 73, and the diode switch 69. The Y axis sustainer circuits are also connected to all other Y axis electrodes through a plurality of D1 diodes and D2 diodes. The circuits 58 and 59 are connected to all the Y axis D1 diodes by a line 74 and to all the Y axis D2 diodes by the diode switch 69 and a line 75.

The Y sustainer circuits are individually enabled to generate the Y axis sustainer wave form 32 of FIG. 3 which is applied to all of the Y axis electrodes. The Y axis sustainer wave form 32 may be identical to the X axis sustainer wave form 31 except that the wave form 32 is shifted in time with respect to wave form 31. When the circuit 58 and the switch 69 are enabled and the circuit 59 is disabled, the Vs potential of the wave form is such that the sustainer current flows through the diode switch and the D2 diodes and the Vs potential appears at all Y axis electrodes. When the circuit 59 is enabled and the circuit 58 is disabled, the ground potential Vg is applied to all Y axis electrodes through the D1 diodes.

The intersection of the X axis electrodes and the Y axis electrodes define a plurality of cells or discharge sites at which the composite sustainer wave form 33 of FIG. 3 appears. As shown in FIG. 4, the X axis electrodes 48 and 53 intersect the Y axis electrodes 66 and 71 to define four cells 76, 77, 78 and 79, each of which is represented by a dashed circle.

A plurality of MOSFETs are utilized in the addressing of the individual electrodes. A MOSFET is a metal oxide semiconductor field effect transistor wherein the gate is formed from a metal film deposited on an oxide layer and is insulated from the source and the drain. The MOSFETs which are shown in FIG. 4 are depletion types having a substrate which is internally terminated to the source. It is advantageous to utilize these MOSFETs as switching means between the addressing circuits and the electrodes since they can be formed as integrated circuits so as to reduce the size of the switching circuits and simplify the circuitry. The MOSFETs shown in FIG. 4 are complementary with N-channel devices used on the Y axis and P-channel devices used on the X axis.

A MOSFET 81 having a source connected to the cathode of the D2 diode 51, a gate connected to receive control signals from circuit 38, and a drain connected to the anode of the D2 diode 51 is utilized in the addressing of the X electrode 48. MOSFETs 82, 83 and 84 are connected in a similar manner across the D2 diodes 55, 68 and 73 respectively. MOSFETs are also connected in a similar manner to the remaining D2 diodes (not shown) of both the X and Y axes. The MOSFETs are normally in the off state, except when it is desired to address a selected cell. At this time the circuit 38 generates the control signals necessary to turn on the pair of MOSFETs connected to the electrodes which correspond to the selected cell. The pair of MOSFETs which have been turned on are then turned off at the termination of the address pulse.

The address pulses which are utilized in the writing and erasing operations of selected cells are generated by a Y axis pulser 85 and either an X axis write pulser 86 or an X axis erase pulser 87. The X axis write pulser 86 is connected to a write power supply 88 to receive a partial select write voltage Vw and the X axis erase pulser 87 is connected to an erase power supply 89 to receive a partial select erase voltage Ve. The Y axis pulser is utilized in generating both an erase and a write address pulse and is connected to a power supply 91 to receive a partial select voltage Vy. In accordance with the present invention, the power supplies 88, 89 and 91 are ground-referenced. The power supplies are individually adjusted to maximize the size of the window, the pulser-sustainer voltage combinations which result in satisfactory operation of the display panel. The write pulser 86 is represented as an NPN transistor 92 having a collector connected to the Vw power supply 88, a base connected to receive control signals from the circuit 38, and an emitter connected to the anode of a blocking diode 93. The cathode of the blocking diode 93 is connected to the line 57. The erase pulser 87 is comprised of an NPN transistor 95 and a blocking diode 94 connected in a manner similar to the corresponding elements of the pulser 86 except that the collector of the transistor 95 is connected to the Ve power supply 89. The Y pulser 91 is represented as an NPN transistor 96 having an emitter connected to the line 75, a base connected to receive control signals on the line 37, and a collector connected to the anode of a diode 97. The cathode of the diode 97 is connected to the Vy power supply.

The circuit 38 supplies the control signals necessary to generate a write or an erase pulse during the appropriate portion of the composite sustainer wave form. A write pulse is generated during the portion of the sustainer wave form when both the X and Y electrodes are at a maximum potential Vs. An erase pulse is generated when the X electrodes are at a minimum potential Vg and the Y electrodes are at a maximum potential Vs. If the cell 76 is selected for writing, the MOSFETs 81 and 83 are turned on and the diode switches 52 and 69 are turned off. The pulsers 85 and 86 are then turned on to generate the desired write pulse. If the cell 76 is selected for erasing, the MOSFETs 81 and 83 are turned on and the diode switches 52 and 69 are turned off. The pulsers 85 and 87 are then turned on to generate the desired erase pulse. Turning off the diode switches blocks the paths for the sustainer voltages to the electrodes, but the nonaddressed electrodes will remain at the X and Y axis sustainer potentials since no other current flow paths exist to either charge or discharge the cells. The writing and erasing of the cells 77, 78 and 79 and all other cells in the panel are accomplished in a similar manner wherein the associated MOSFETs are turned on. The utilization of ground referenced voltage sources eliminates the need for floating power supplies in the addressing circuits.

In summary, the present invention concerns an operating system for a multicelled gas discharge display/memory device wherein a pair of opposed electrode arrays with proximate portions of at least one electrode in each array define the cells. A sustainer voltage source cyclically imposes a pulsating voltage having a period and a maximum potential Vs across each of the cells. A switching means is provided to select a pair of opposed electrodes corresponding to a selected cell. An addressing means generates address voltage pulses to manipulate the discharge state of individual cells between an "on state" and an "off state." In accordance with the present invention, the address pulses are generated with voltage magnitudes which are independent of the sustainer voltage. Typically, the pulses are generated by a pulser means referenced to the ground potential. The utilization of ground referenced voltage sources eliminates the need for floating power supplies in the addressing circuits.

The switching means comprises a plurality of normally open switches, each one of which is connected between the addressing means and an electrode of the pair of opposed spaced electrode arrays. When addressing a cell, the switches which are connected to the pair of opposed electrodes which define a selected cell are closed during the generation of an address pulse. Typically, the switches are transistors such as MOSFETs or similar devices which can easily be fabricated as integrated circuits.

The addressing means includes a first pulser means connected to one electrode array for generating a first partial select voltage pulse and a second pulser means connected to the other electrode array for generating a second partial select voltage pulse. The two partial select pulses combine to form the desired address voltage pulse across a selected cell. Furthermore, the first pulser means includes a separate write pulser and a separate erase pulser which generate a write and an erase partial select voltage pulse repsectively. The write and erase pulses combine with the second partial select voltage pulses to form the write address voltage pulse with a first predetermined magnitude and the erase address voltage pulse with a second predetermined magnitude. The magnitudes of the write and erase partial select pulses can be individually adjusted to maximize the addressing window size and reduce crosstalk between adjacent cells.

In accordance with the provisions of the patent statutes, the principle and mode of operation of the invention have been explained and illustrated in its preferred embodiment. However, it must be understood that the invention may be practiced otherwise than as specifically illustrated and described without departing from its spirit or scope.

What is claimed is:

1. In an operating system for a gas discharge display/memory cell defined by proximate electrode portions of a pair of opposed spaced electrodes; an ionizable gas volume between the spaced electrode portions of the cell; a dielectric charge storage member in contact with the gas insulating at least one electrode portion of the cell from the gas; a sustainer voltage source for cyclically imposing a pulsating voltage having a period and a predetermined maximum potential referenced from a ground potential across the cell; and an addressing means for generating address voltage pulses to manipulate the discharge state of the cell between an "on state" and an "off state," the improvement comprising:

means for generating write and erase address voltage pulses included in the addressing means, said write pulse referenced from the ground potential for changing the cell from the "off state" to the "on state" and said erase pulse referenced from the ground potential for changing the cell from the "on state" to the "off state"; and switching means connected between the addressing means and the pair of opposed spaced electrodes for applying said write and erase pulses to the cell.

2. A system according to claim 1 wherein said address voltage pulse generating means generates said write pulse with a first predetermined magnitude and generates said erase pulse with a second predetermined magnitude.

3. A system according to claim 1 wherein said switching means is a metal oxide semiconductor field effect transistor.

4. In an operating system for a multicelled gas discharge display/memory device, the device including a pair of opposed spaced electrode arrays with proximate electrode portions of at least one electrode in each array defining the cells; an ionizable gas volume between the spaced electrode portions of each cell; a dielectric charge storage member in contact with the gas insulating at least one electrode portion of each cell from the gas; a sustainer voltage source for cyclically imposing a pulsating voltage having a period and a predetermined maximum potential referenced from a ground potential across each of the cells; and an addressing means for generating address voltage pulses to manipulate the discharge state of individual selected cells between an "on state" and an "off state," the improvement comprising:

means for generating write and erase address voltage pulses included in the addressing means, said write pulse referenced from the ground potential for changing the selected cells from the "off state" to the "on state" and said erase pulse referenced from the ground potential for changing the selected cells from the "on state" to the "off state"; and switching means comprising a plurality of switches each connected between said addressing means and one of the electrodes of said pair of electrode arrays.

5. A system according to claim 4 wherein said address voltage pulse generating means generates said write pulse with a first predetermined magnitude and generates said erase pulse with a second predetermined magnitude.

6. A system according to claim 4 wherein said address voltage pulse generating means includes a first pulser means connected to one of the electrode arrays for generating a first partial select voltage pulse and a second pulser means connected to the other electrode array to generate a second partial select voltage pulse to form said address voltage pulses.

7. A system according to claim 6 wherein said first pulser means includes a write pulser means for generating a write partial select voltage pulse wherein said write partial select voltage pulse and said second partial select voltage pulse form said write pulse and includes an erase pulser means for generating an erase partial select voltage pulse wherein said erase partial select voltage pulse and said second partial select voltage pulse form said erase pulse.

8. A system according to claim 4 wherein said switching means switches are metal oxide semiconductor field effect transistors.

* * * * *

Notice of Adverse Decision in Interference

In Interference No. 100,673, involving Patent No. 4,128,901, J. W. V. Miller, GROUND-REFERENCE POWER SUPPLY FOR GAS DISCHARGE DISPLAY/MEMORY PANEL DRIVING AND ADDRESSING CIRCUITRY, final judgment adverse to the patentee was rendered Aug. 29, 1984, as to claims 1, 2 and 4–7.

[*Official Gazette January 29, 1985.*]